(12) United States Patent
Shima

(10) Patent No.: US 8,188,553 B2
(45) Date of Patent: May 29, 2012

(54) SEMICONDUCTOR DEVICE AND METHOD FOR MAKING THE SAME

(75) Inventor: Masashi Shima, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 185 days.

(21) Appl. No.: 11/853,195

(22) Filed: Sep. 11, 2007

(65) Prior Publication Data

US 2008/0048210 A1 Feb. 28, 2008

Related U.S. Application Data

(63) Continuation of application No. PCT/JP2005/004314, filed on Mar. 11, 2005.

(51) Int. Cl.
*H01L 29/02* (2006.01)

(52) U.S. Cl. ........ 257/402; 257/190; 257/196; 257/200; 257/E29.081

(58) Field of Classification Search ................. 257/190, 257/200, 196, 402, E29.089
See application file for complete search history.

(56) References Cited

U.S. PATENT DOCUMENTS

| 2003/0162335 A1 | 8/2003 | Yuki et al. |
| 2006/0091377 A1* | 5/2006 | Boyd et al. ............ 257/19 |

FOREIGN PATENT DOCUMENTS

| JP | 09-082610 | * 10/1998 |
| JP | H09-082610 | * 10/1998 |
| JP | 2000269501 A | 9/2000 |
| JP | 2000332235 A | * 11/2000 |
| JP | 2000332235 A | * 11/2000 |

OTHER PUBLICATIONS

Chang-Geun Ahn et al.; "Effects of Segregated Ge on Electrical Properties of SiO2/SiGe Interface", Mar. 1998, Japanese Journal of Applied Physics Part 1—Regular Papers Short Notes & Review Papers, vol. 37, No. 3B, pp. 1316 to 1319.
Yee-Chia Yeo et al., "Enhanced Performance in Sub-100 nm CMOSFETs using Strained Epitaxial Silicon-Germanium"; IEDM Technical Digest, Dec. 10, 2000.

(Continued)

*Primary Examiner* — Zandra Smith
*Assistant Examiner* — Jamie C Niesz
(74) *Attorney, Agent, or Firm* — Westerman, Hattori, Daniels & Adrian, LLP

(57) ABSTRACT

In a MOS-type semiconductor device in which, on a Si substrate (201), a SiGe layer (202) having a valence band edge energy value smaller than a valence band edge energy value of the first semiconductor layer and a mobility larger than a mobility of the first semiconductor layer, a Si cap layer (203), and an insulating layer (204) are sequentially laminated, the problem of the shift of the absolute value of the threshold voltage toward a smaller value caused by negative fixed charges formed in or near the interface between the Si cap layer (203) and the insulting film (204) by diffusion of Ge is overcome by neutralizing the negative fixed charges by positive charges induced in and near the interface between the Si cap layer and the insulating film along with addition of nitrogen atoms to the semiconductor device surface by NO gas annealing and thereby shifting the threshold voltage toward a larger value.

10 Claims, 10 Drawing Sheets

OTHER PUBLICATIONS

International Search Report of PCT/JP2005/004314, date of mailing Jun. 14, 2005.

Office Action from the State Intellectual Property office of the People's Republic of China dated Mar. 13, 2009 issued in corresponding Chinese patent Application No. 2005800490512.

Japanese Office Action dated Oct. 18, 2011, issued in corresponding Japanese Patent Application No. 2007-507949.

Kwa, K.S. K., et al., "Optimisation of channel thickness in strained Si/SiGe MOSFETs" European Solid-State Device Research, 2003 33rd Conference on ESSDERC 03, 2003, pp. 501-504.

* cited by examiner

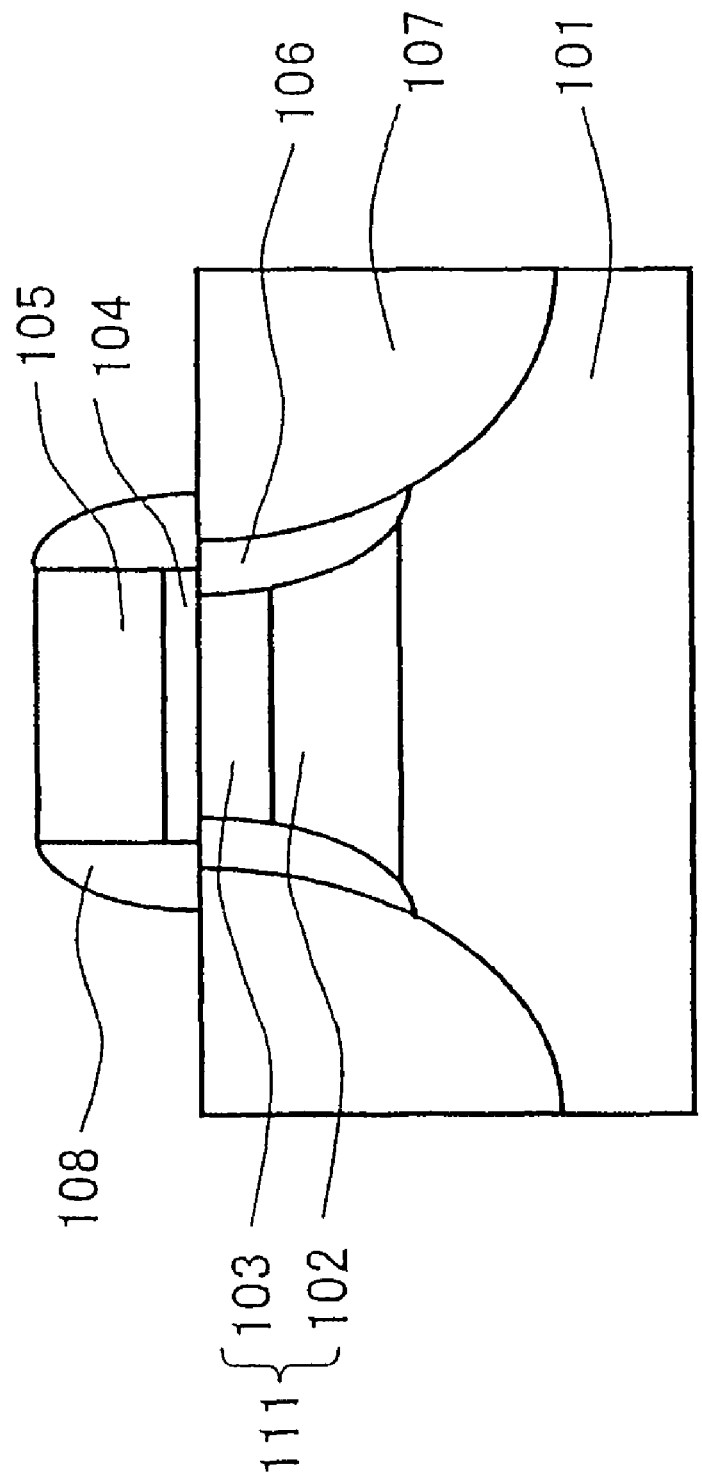

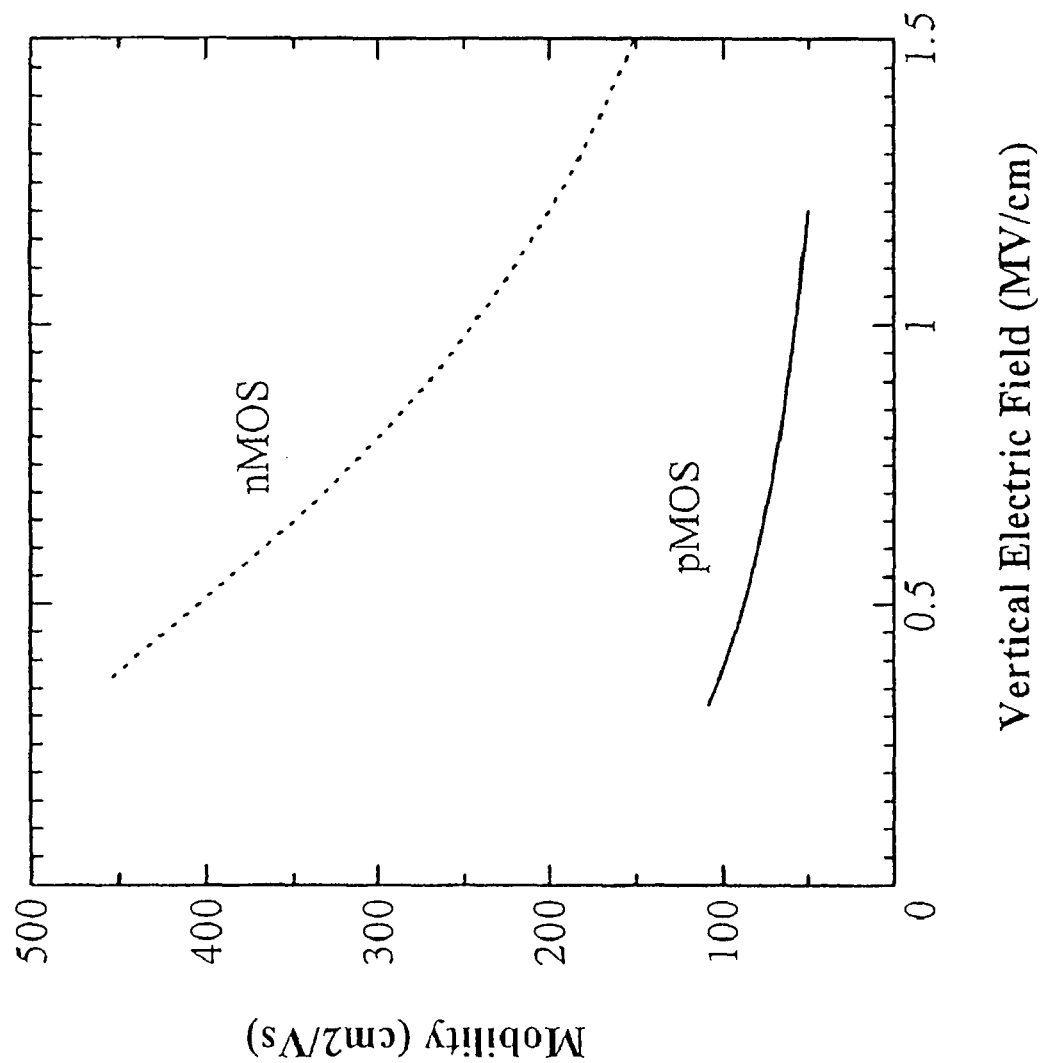

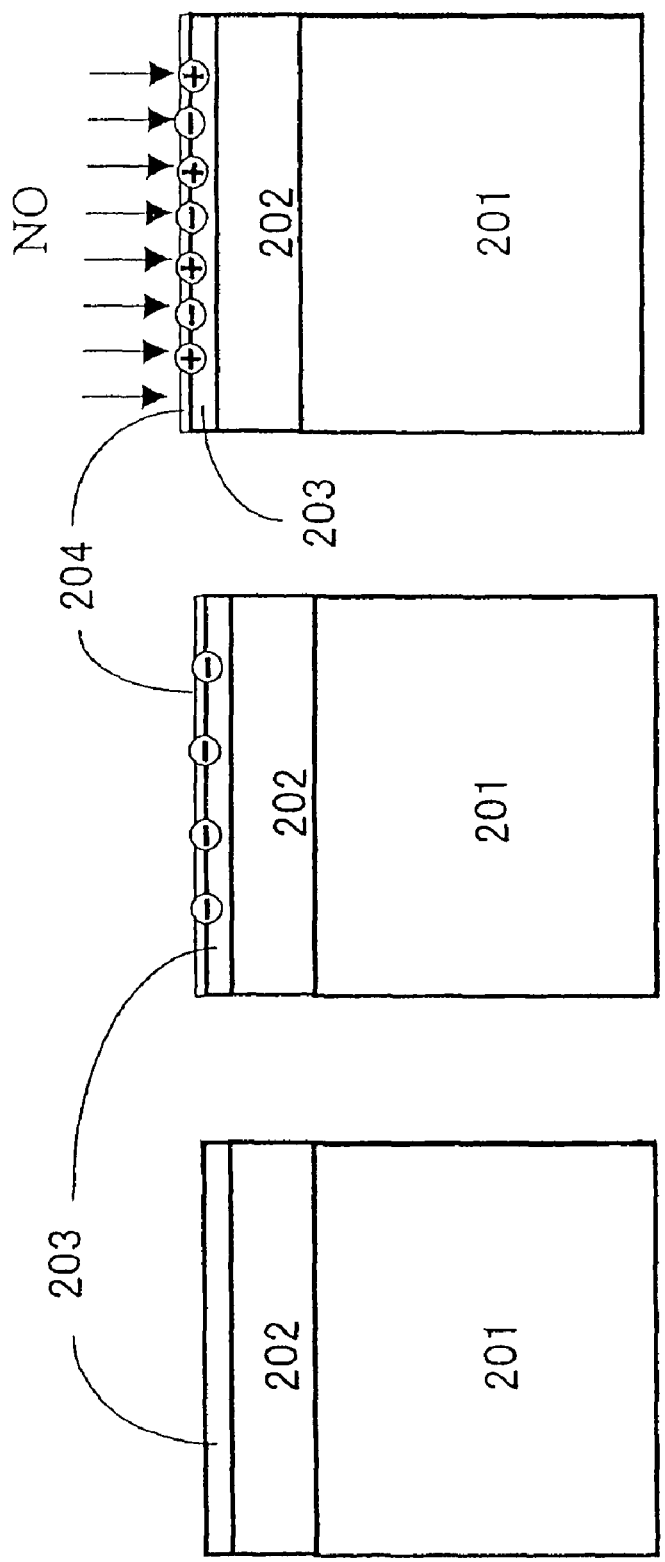

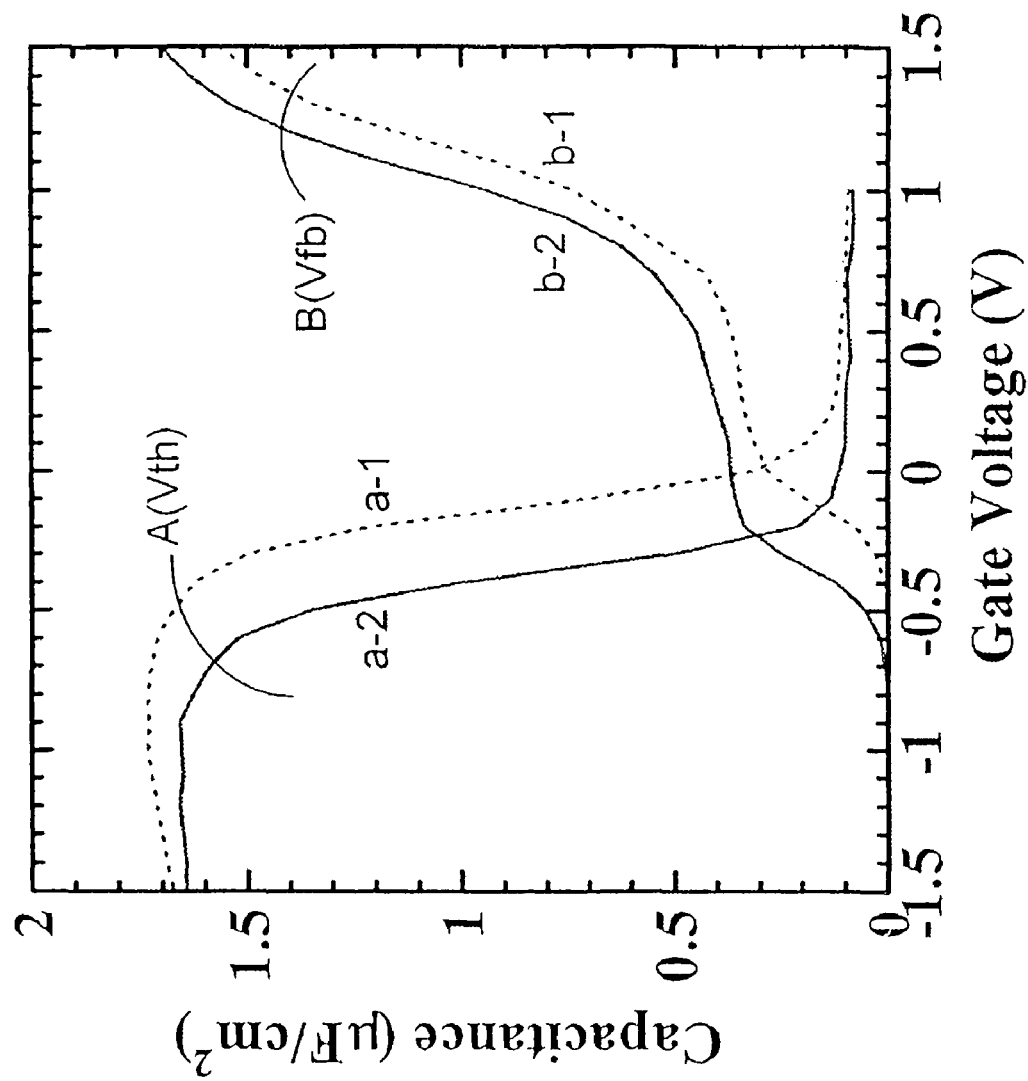

SEMICONDUCTOR DEVICE AND METHOD FOR MAKING THE SAME

BACKGROUND OF THE INVENTION

1. Field of the Invention

The present invention relates to semiconductor devices and methods for making the semiconductor devices. In particular, it relates to increasing the speed of and decreasing the power consumption of a MIS-type transistor having a hetero junction structure in which two types of semiconductor layers having different lattice constants are laminated.

2. Description of the Related Art

Speeding up and refinement of a MIS-type transistor by using a single semiconductor such as silicon (Si) have been pursued according to the scaling law but are now about to reach their limits. As a breakthrough to this situation, development of a technology that changes the physical properties of the channel material, i.e., a MOS-transistor having a heterojunction structure in which a layer with a different lattice constant is introduced to apply a strain onto the laminated crystals to form a channel and to thereby increase the carrier mobility, is now actively studied (e.g., Non-patent document 1).

FIG. 1 is a schematic cross-sectional view of a strained MOS-transistor in which a silicon germanium (SiGe) layer having a lattice constant larger than that of a Si layer is provided in addition to the Si layer. In this strained SiGe MOS transistor, a semiconductor film 111 is formed by epitaxially growing a SiGe layer 102 on a Si substrate 101 and then forming thereon a Si layer 103 which serves as a cap film for forming a gate insulating film, and a gate electrode 105 is formed on the semiconductor film 111 with a gate insulating film 104 therebetween. A side wall insulating film 108 is formed on the side wall of the gate electrode 105 so as to also cover part of the surface of the semiconductor film 111. A dopant is introduced into the semiconductor film 111 in regions at the both sides of the gate electrode 105 so that an extension region 106 and a source/drain region 107 define a channel region and that the compressive strain is introduced to the channel region.

According to a p-type MOS transistor having such a structure, the SiGe layer 102 having a compressive strain forms a hole channel layer; thus, hole mobility can be remarkably enhanced and the driving current can be increased.

In an n-type MOS transistor, the Si layer 103 and the SiGe layer 102 function as electron channel layers with low electric field.

Non-patent document 1: Sophie Verdonckt-Vandebroek et al., "SiGe-Channel Heterojunction p-MOSFET's", IEEE TRANSACTIONS ON ELECTRON DEVICES, Vol, 41, p. 90 (1994)

SUMMARY OF THE INVENTION

According to an aspect of an embodiment, a semiconductor device includes a second semiconductor layer on a first semiconductor layer, the second semiconductor layer having a valence band edge energy value smaller than a valence band edge energy value of the first semiconductor layer, and a third semiconductor layer having a mobility larger than a mobility of the first semiconductor layer, having a valence band edge energy larger than the valence band edge energy of the second semiconductor layer, wherein an insulating layer are sequentially stacked, in which negative fixed charges introduced into and near an interface between the third semiconductor layer and the insulating layer are neutralized by introduction of positive fixed charges into and near the interface between the third semiconductor layer and the insulating layer.

According to another aspect of an embodiment, a method for making a semiconductor device includes a step of forming on a first semiconductor layer a second semiconductor layer having a valence band edge energy value smaller than a valence band edge energy value of the first semiconductor layer and a mobility larger than a mobility of the first semiconductor layer, a step of forming on the second semiconductor layer a third semiconductor having a valence band edge energy larger than the valence band edge energy of the second semiconductor layer, a step of forming a semiconductor laminated structure by forming an insulating layer on the third semiconductor layer, a step of introducing first positive fixed charges into and near an interface between the first semiconductor layer and the second semiconductor layer of the semiconductor laminated structure, a step of introducing negative fixed charges into and near an interface between the second semiconductor layer and the third semiconductor layer, a step of introducing second positive fixed charges into and near the interface between the third semiconductor layer and the insulating layer, and a step of controlling the total of the first positive fixed charges, the second positive fixed charges, and the negative fixed charges to a positive value.

BRIEF DESCRIPTION OF THE DRAWINGS

FIG. 1 is a cross-sectional view showing a strained SiGe MOS transistor;

FIG. 2 is a graph showing the relationship between the intensity of the vertical electric field and the mobility in a MOS transistor;

FIG. 3 includes Cross-sectional process diagrams showing a process of making a semiconductor device according to a first embodiment of the present invention;

FIG. 4 is a graph explaining changes in flat band voltage Vfb and threshold voltage Vth according to the first embodiment of the present invention;

BEST MODE FOR CARRYING OUT THE INVENTION

Description of the Preferred Embodiments

Figure 5C:
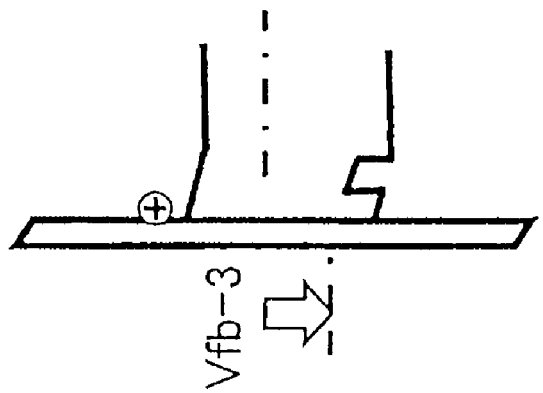
FIG. 5 includes Energy band structural diagrams at flat band voltage for explaining the method for making the semiconductor device according to the first embodiment of the present invention.

The present invention is described in further detail below with reference to specific embodiments.

First Embodiment

In a strained MOS transistor including a SiGe layer having a lattice constant larger than that of a Si layer, the Si layer 103 serving as a cap film is usually provided between the SiGe layer 102 and the gate insulating film 104, as shown in FIG. 1. This Si layer 103 is interposed to avoid a phenomenon of increased interface level or fixed charges at the interface of the gate insulating film 104 caused by germanium (Ge) as a result of direct contact between the gate insulating film 104 and the SiGe layer 102. It is known that formation of the interface level and fixed charges (negative charges) caused by Ge shifts the flat band voltage Vfb of the MOS device, i.e., shifts Vfb toward a larger absolute value, and the related art discloses that the shift of flat band voltage Vfb can be avoided by introduction of the Si layer 103 as a cap film (e.g., Patent document 1).

The shift of flat band voltage Vfb toward a larger absolute value caused by negative charges near the interface due to diffused Ge causes the threshold voltage Vth to shift toward a smaller absolute value. This results in degradation in transistor characteristics and a decrease in yield.

According to our understanding, however, the shift of flat band voltage Vfb cannot be avoided by introducing a cap layer if the Si layer 103 is as thin as about 5 nm, in particular. We have noticed a problem that, by a thermal process for forming a MOS transistor, Ge in the Sie layer diffuses into the Si layer 103 to thereby form negative fixed charges near the interface between the Si layer 103 and the gate insulating film 104, and, as a result, the absolute value of the flat band voltage Vfb shifts toward a larger value and the absolute value of the threshold voltage Vth shifts toward a smaller value.

In other words, the p-type MOS transistor will suffer from problems of decreased threshold voltage and increased off-current. In contrast, the n-type MOS transistor will suffer from problem of shift of the threshold voltage toward a larger value and failure of obtaining sufficient driving current at low voltage.

In order to overcome such problems, for example, there is an approach where the threshold voltage is adjusted to be high to moderate the increase in off-current of a p-type MOS transistor. One possible technique to achieve this is to increase the dopant concentration in the channel region. However, this technique increases the vertical electric field in the channel region and decreases the carrier mobility. This is shown in FIG. 2. FIG. 2 shows results of computation of the characteristics of p-type and n-type MOS transistors and has the abscissa indicating the vertical electric field in the channel region and the ordinate indicating the mobility. As is evident from this graph, the mobility decreases with an increase in vertical electric field in both p-type and n-type. In addition to this phenomenon, a so-called parallel channel occurs in the strained SiGe p-type MOS transistor shown in FIG. 1. The parallel channel is induction of not only the holes of the strained SiGe layer having a high mobility in a low-electric-field region but also the holes having a low mobility in and near the Si layer serving as a cap layer along with increasing electric field in the channel region. As the electric field further increases, the holes with low mobility become dominant and the average carrier mobility is further decreased, which is problem.

In order to avoid induction of holes having low mobility in the cap Si layer such as above in a strained SiGe p-type MOS transistor, there has been suggested a technique of cutting the width of the cap Si layer to the width of the gate insulating film in a self-aligning manner (Patent document 1). However, according to this technique, depletion from the edge portions of the gate insulating film occurs, and thus the parasitic resistance is increased. As a result, the driving current is degraded, which is not desirable.

There has also been suggested formation of a p-type dopant Si layer in a strained SiGe n-type MOS transistor rather than formation of a usual low-concentration n-type dopant Si layer as the cap Si layer to suppress an increase in threshold voltage (Patent document 2).

However, according to this technique, since the cap Si layer is p-type, negative charges occur in this layer and the flat band voltage and the threshold voltage of the MOS transistor are shifted to the positive side. Although this is overcome by suppressing the threshold voltage by increasing the n-type dopant in the Si buffer layer (Si substrate directly below the SiGe layer) and the SiGe channel, this induces an increase in vertical electric field as described above. As a result, the same problem of degradation in carrier mobility remains.

As discussed above, there has been no effective means to overcome the problem of occurrence of negative fixed charges at the interface between the gate insulating film 104 and the Si layer 103 by diffusion of Ge.

An object of the present invention is to provide a semiconductor device in which effective countermeasure is taken against induction of the aforementioned negative fixed charges in a strained SiGe MOS transistor, and a method for making such a device. A further object of the present invention is to provide a semiconductor device that achieves low power consumption, high driving current, and suppression of shifting toward low mobility by intentionally controlling and introducing not only negative fixed charges but also positive fixed charges in and near the laminated structure of the strained SiGe MOS transistor, and a method for making such a device.

Patent document 1: Japanese Unexamined Patent Application Publication No. 10-284722

Patent document 2: Japanese Unexamined Patent Application Publication No. 2002-373985

A semiconductor device and a method for making the device according to a first embodiment of the present invention will now be described with reference to FIGS. 3 to 5.

FIG. 3 includes schematic cross-sectional views of production steps related to a major laminated semiconductor structure according to the first embodiment of the semiconductor device of the present invention. Although the description below are provided as an example of forming a p-type MOs structure, the same advantages can be achieved also in an n-type MOS structure by changing the dopant in the semiconductor layer to one having an opposite conductivity type. As shown in FIG. 3A, for example, in order to control the threshold voltage Vth, for example, an n-type SiGe layer 202 having a thickness of 15 nm and a Ge content of 20% is epitaxially grown on an n-type Si substrate 201 doped with arsenic (As) at $1\times10^{18}/cm^3$ by chemical vapor deposition (CVD), and then a Si cap layer 203 having a thickness of, for example, 5 nm is epitaxially grown on the n-type SiGe layer 202.

Subsequently, as shown in FIG. 3B, an oxynitride film (SiON film) 204 serving as a gate insulating film and having a thickness of about 1.5 nm is formed on the Si cap layer 203. Here, Ge in the SiGe layer 202 diffuses into the interface between the oxynitride film 204 and the Si cap layer 203 and the vicinity of the interface due to heat of combustion of the oxynitride film and the relatively thin Si cap layer, thereby creating negative fixed charges at and near the interface.

Then, as shown in FIG. 3C, nitric oxide (NO) gas annealing is conducted at 1000° C. for 10 seconds, for example, to introduce nitrogen atoms from the surface and generate positive fixed charges at and near the interface between the Si cap layer 203 and the oxynitride film 204. By this process, neutralization of the negative fixed charges that have been induced by the previous step becomes possible.

FIG. 4 is a computation results showing the effect of neutralization described above obtained by a split C-V technique. This graph has the abscissa indicating gate voltage and the ordinate indicating the normalized volume of the sample and shows the measurement results of the samples produced.

Changes in threshold voltage Vth (curves a-1 and a-2 indicated as A) and flat band voltage Vfb (curves b-1 and b-2 indicated as B) can be detected from these measurement results. In the graph, curves a-1 and b-1 are the curves for FIG. 3B at the time of an oxynitride film formation and curves a-2 and b-2 are the curves for FIG. 3C after the NO gas annealing.

As is apparent from the above, whereas the flat band voltage Vfb is shifted toward a larger absolute value by the negative fixed charges at the interface between the oxynitride film 204 and the Si cap layer 203 by Ge diffusion, as shown by curve b-1, and the threshold voltage Vth is shifted toward a smaller absolute value as shown by curve a-1, Vfb and Vth are both shifted back (in this case, about −100 mV shift) in the original direction as shown by curves b-2 and a-2 by neutralization of negative fixed charges by formation of the positive fixed charges at and near the interface between the Si cap layer 203 and the oxynitride film 204 after the NO annealing. In other words, the flat band voltage Vfb is shifted toward a smaller absolute value and the threshold voltage Vth is shifted toward a larger absolute value (in this case, about −250 mV shift), i.e., the threshold shift due to generation of negative fixed charges by Ge diffusion can be corrected without performing a process of increasing the dopant in the channel region or the like.

Figure 5B:
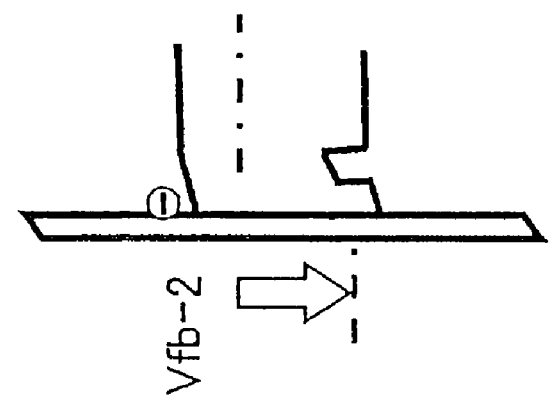
Figure 5A:
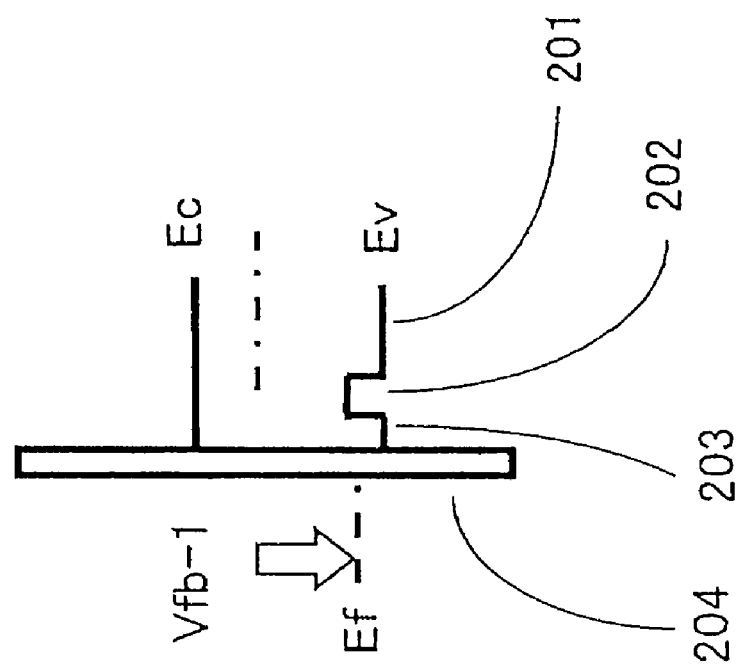

FIG. 5 includes diagrams for explaining changes during introduction of fixed charges in the above-described MOS structure (p-type MOSFET) by using the energy band structure in the flat band voltage Vfb. FIG. 5A shows an energy band structure in which the SiGe layer 202 having a large lattice constant is formed on the n-type Si substrate 201 (n-type Si substrate) to form a heterojunction, the Si cap layer 203 is formed thereon, and the oxynitride film 204 serving as the gate insulating film is formed thereon. In the drawing, Ec represents a conduction band edge, Ev represents a valence band edge, and Ef represents a Fermi level. The SiGe layer 202 has an offset at the valence band edge-side and the bandgap thereof is narrower than that of Si. The drawing shows that by applying a negative flat band voltage corresponding to the value of Vfb-1 indicated by the arrow onto the gate, the band can be made flat.

According to this structure, when negative fixed charges are introduced to the vicinity of the interface between the oxynitride film 204 and the Si cap layer 203, the band structure changes as shown in FIG. 5B. Here, the absolute value of the flat band voltage Vfb-2 is larger than that of Vfb-1 and the threshold voltage Vth (absolute value) becomes lower. This situation corresponds to the previously described state in which negative fixed charges are generated at the interface by diffusion of Ge shown in FIG. 3B. In contrast, when positive charges are introduced to the interface between the oxynitride film 204 and the Si cap layer 203 and the interface between the SiGe layer 202 and the Si substrate 201, the band structure changes as shown in FIG. 5C. Here, the absolute value of the flat band voltage Vfb-3 is smaller than that of Vfb-1 and the threshold voltage Vth (absolute value) becomes larger. This situation corresponds to the above-described state in which positive fixed charges are generated near the interface after NO annealing in the absence of negative fixed charges, for example.

The flat band voltage and the threshold voltage can be controlled by changing the band structure near the interface by the introduction of negative or positive fixed charges to the vicinities of the interfaces of the laminated substrate. The process related to the semiconductor device of the present invention shown in FIG. 3 can be reworded as a process of making the MOS structure that has once changed to one shown in FIG. 5B return to the structure shown in FIG. 5A by using the effect of FIG. 5C.

In view of the above, it can be understood that induction of negative fixed charges accompanying the Ge diffusion that poses problem during formation of a strained SiGe MOS transistor and the changes (shifts) in flat band and threshold voltage induced thereby can be overcome by the first embodiment of the present invention. A generally conceivable approach is to correct shifts of threshold voltage of a p-type MOS transistor with a SiGe layer serving as a channel or an n-type MOS transistor with Si cap layer/SiGe layer serving as a channel by increasing the channel dopant concentration or the like; however, shifts can be corrected without employing such a process that causes degradation of mobility. Furthermore, the off-current of the p-type MOS transistor can be reduced and the low voltage operation of the n-type MOS transistor can be made possible.

Second Embodiment

Control of the threshold voltage of a strained SiGe MOS transistor and suppression of degradation of mobility can be further effectively conducted by combining changes in band structure caused by introduction of positive or negative fixed charges at or near the interfaces of the layers, shifts of flat bands resulting therefrom, and the shift of threshold voltage resulting therefrom.

As a second embodiment, a semiconductor device in which control of threshold voltage by introduction of positive and negative fixed charges and further suppression of degradation of mobility by formation of parallel channels in the Si cap layer are achieved in a strained SiGe p-type MOS transistor and a method for making such a semiconductor device is described.

FIG. 6 includes drawings related to a MOS structure (p-type MOSFET) as are FIG. 5, the drawings explaining changes during introduction of fixed charges in the device of this embodiment by using the energy band structure for the flat band voltage Vfb. The meanings of the reference characters in FIG. 6 are the same as those in FIG. 5.

Figure 6A:
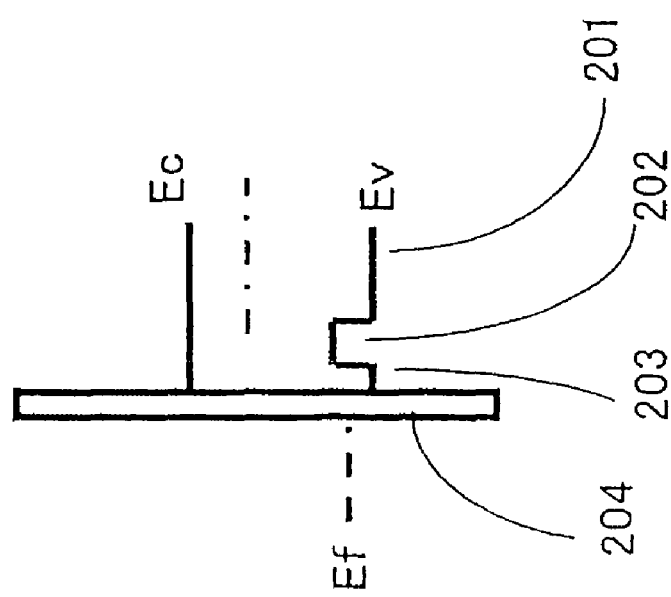
FIG. 6 includes Energy band structural diagrams at flat band voltage for explaining the method for making a semiconductor device according to a second embodiment of the present invention.
Figure 6B:
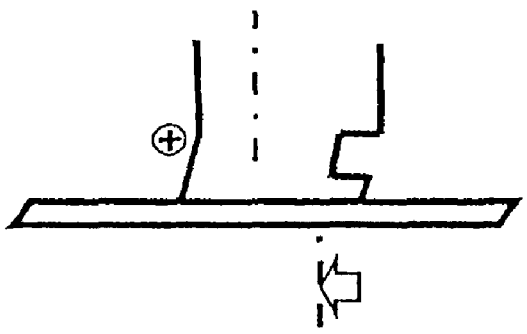

Whereas FIG. 6A shows the energy band structure in which no fixed charges are introduced to the interfaces of the layers of the laminated semiconductor substrate, positive fixed charges are introduced near the interface between the Si substrate 201 and the SiGe layer 202 in FIG. 6B. In this manner, the absolute value of the flat band voltage Vfb is shifted to a smaller value and the absolute value of the threshold voltage is shifted to a larger value. Along with the increase in negative bias application, parallel channels are easily formed in the Si cap layer 203 in addition to the SiGe layer 202 serving as a carrier region. As a result, the total hole carrier mobility becomes smaller (degraded).

Figure 6C:
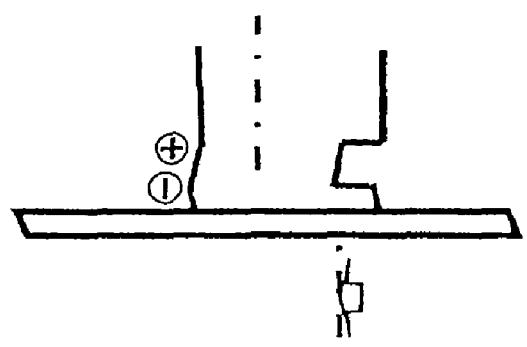

Next, as shown in FIG. 6C, negative fixed charges are further introduced to near the interface between the type SiGe layer 202 and the Si cap layer 203. In this manner, the absolute value of the flat band voltage Vfb is shifted toward a larger value, and the absolute value of the threshold voltage Vth is shifted to a smaller value. Because the negative fixed charges exist at this position, generation of low mobility (generation of parallel channels) can be suppressed from the interface between the oxynitride film 204 and the Si cap layer 202 despite the application of a negative bias to the gate. As a result, the mobility is shifted toward a larger value.

Figure 6D:
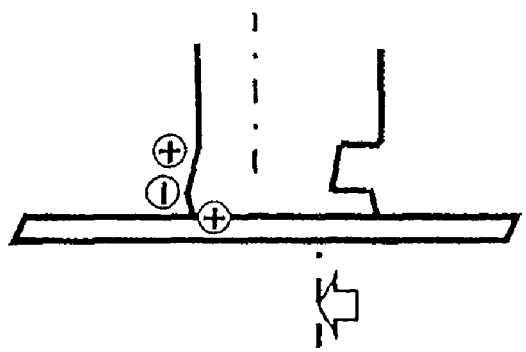

Next, as shown in FIG. 6D, positive fixed charges are introduce to near the interface between the Si cap layer 203 and the oxynitride film (SiON film) 204 serving as the gate insulating film so that the total fixed charge is positive as a whole. As a result, a semiconductor device in which the absolute value of the flat band voltage Vfb is shifted to a smaller value, the absolute value of the threshold voltage Vth is shifted to a larger value, the carrier region is present only in the SiGe layer 202 to suppress generation of parallel channel, and the mobility is high can be obtained.

A method for making the semiconductor device of the second embodiment will now be described with reference to FIGS. 7 to 10. Each figure is a schematic cross-sectional process diagram showing the process of making a p-type MOS transistor.

Figure 7A:
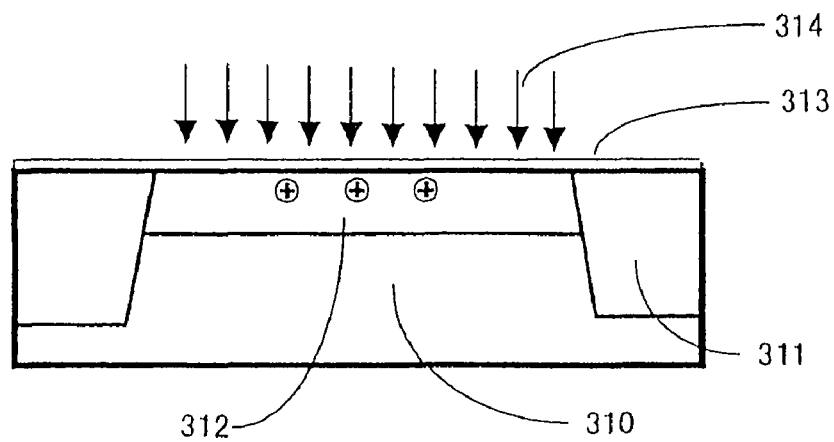
FIG. 7 includes Cross-sectional process diagrams (No. 1) showing a method for making the semiconductor device according to the second embodiment of the present invention.

As shown in FIG. 7A, an element separation region 311 for defining an element region is formed in a Si substrate 310 by a shallow trench isolation (STI) technique by which an insulator such as silicon oxide film is filled in grooves formed in the corresponding regions of the Si substrate 310, for example.

Next, a channel dope layer 312 is formed in the Si substrate 310 by introducing an n-type dopant in the Si substrate 310 by, for example, ion implantation. The channel dope layer 312 is provided to control the threshold voltage Vth to a predetermined level. Arsenic (As) is used as an n-type dopant, for example, and the acceleration voltage for ion implantation is adjusted to about 100 kev and the dosage is adjusted to $1\times10^{18}/cm^2$. An oxide film 13 having a thickness of about 1 nm is formed by thermal oxidation, for example, and then NO gas annealing is conducted at 1000° C. for 10 seconds to introduce nitrogen 314 to the vicinity of the surface of the Si substrate 310 (channel dope layer 312) to introduce positive fixed charges here.

Figure 7B:
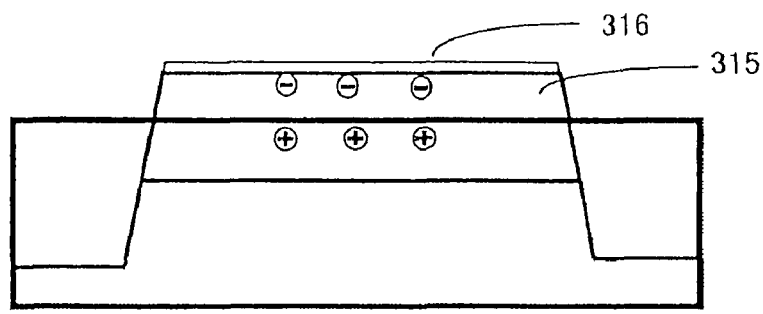

Next, as shown in FIG. 7B, the oxide film 313 is removed, and a channel layer, which is a SiGe layer 315, is deposited on the element region by, for example, a CVD process. The composition of the SiGe layer 315 is, for example 0.8 Si and 0.2 Ge and the thickness is about 5 nm. An oxide film 316 about 1 nm in thickness is formed thereon by, for example, thermal oxidation so that Ge in the SiGe layer diffuses into the interface between the oxide film 316 and the SiGe layer 315 by the heat treatment and negative charges are introduced therein.

Figure 7C:
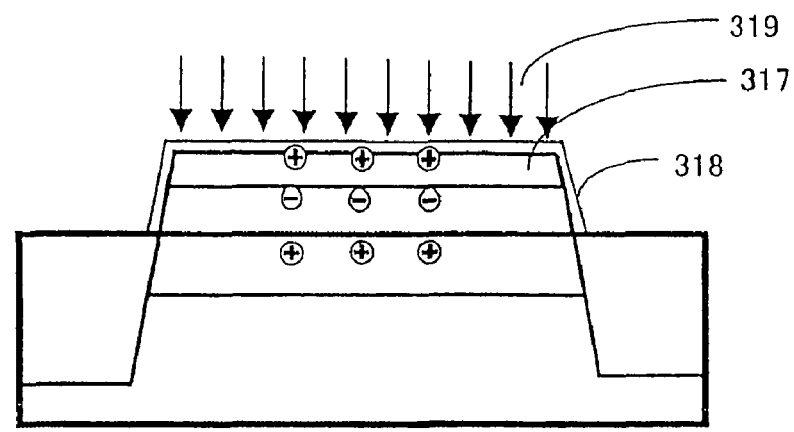

Next, as shown in FIG. 7C, the oxide film 316 is removed, and then a Si layer 317 serving as a cap layer is formed by, for example, a CVD process. The thickness of the Si layer is, for example, about 5 nm. An oxynitride film of silicon (SiON film) 318 is then formed thereon as the gate insulating film. The thickness of the oxynitride film 318 is, for example, about 1 nm. NO gas annealing is again performed at 1000° C. for 10 seconds, for example, to introduce nitrogen 319 to the interface between the oxynitride film 318 and the Si layer 317 so as to introduce positive fixed charges here. During this process, the total of the fixed charges introduced to the three interfaces is controlled in advance to be positive by, for example, controlling the NO gas annealing conditions and the like.

Subsequently, a process of forming a p-type MOS transistor is continued using a laminated substrate with fixed charges introduced thereto, the laminated structure being constituted from Si substrate 310 (channel dope layer 312)/SiGe layer 315/Si layer 317 serving as a cap layer/oxynitride film 318 serving as a gate insulating film.

Figure 8A:
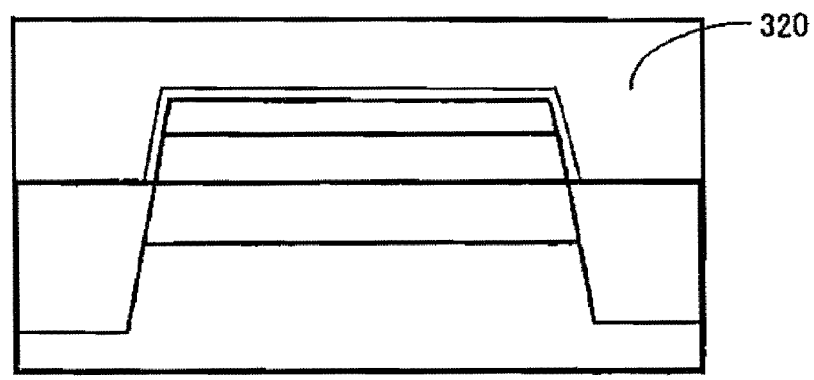
FIG. 8 includes Cross-sectional process diagrams (No. 2) showing the method for making the semiconductor device according to the second embodiment of the present invention.

As shown in FIG. 8A, a polysilicon film 320 is deposited on the entire surface by, for example, a CVD process. The thickness of the polysilicon film 320 is, for example, about 100 nm.

Figure 8B:
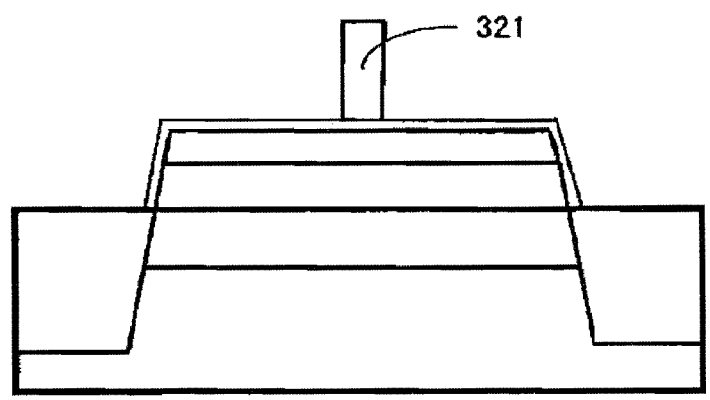

Then, as shown in FIG. 8B, a photoresist film is subjected to patterning by a photolithographic process so as to dry-etch the polysilicon film 320 to form a gate electrode 321 composed of the polysilicon film.

Figure 8C:
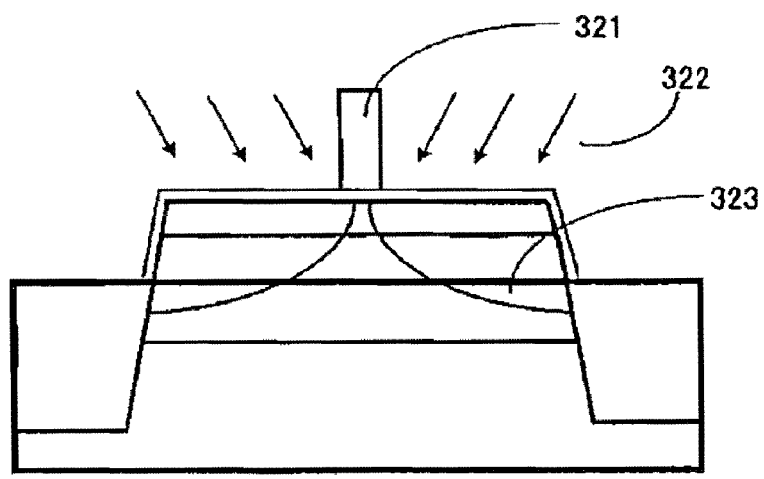

Next, as shown in FIG. 8C, an n-type dopant 322 is implanted in a 45° diagonal direction with respect to the substrate surface by, for example, an ion implantation process. In this manner, an n-type pocket region 323 is formed. As the n-type dopant, arsenic (As) is used, for example, at a dosage of, for example, about $1\times10^{13}/cm^2$ and an ion implantation acceleration voltage of, for example, about 30 kev.

Figure 9A:
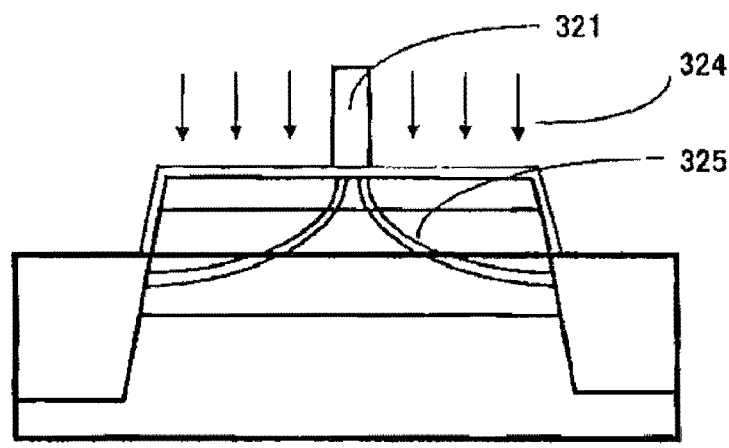
FIG. 9 includes Cross-sectional process diagrams (No. 3) showing the method for making the semiconductor device according to the second embodiment of the present invention.

Next, as shown in FIG. 9A, a p-type dopant 324 is introduced into the substrate using the gate electrode 321 as a mask by, for example, an ion implantation process. As the p-type dopant, boron (B) is used. The acceleration voltage for ion implantation is for example about 1 kev, the dosage is, for example about $1\times10^{14}$ $cm^2$, and the angle of inclination is set to 0° to form an extension region 325.

Figure 9B:
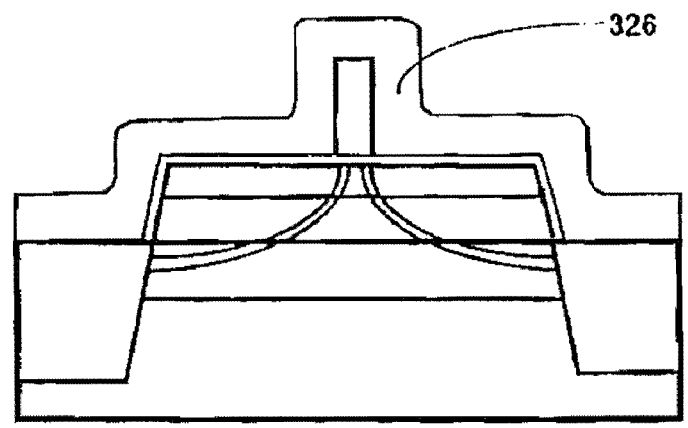

Next, as shown in FIG. 9B, a silicon oxide film 326 is formed to cover the entire gate electrode 321 by, for example, a CVD process.

Figure 9C:
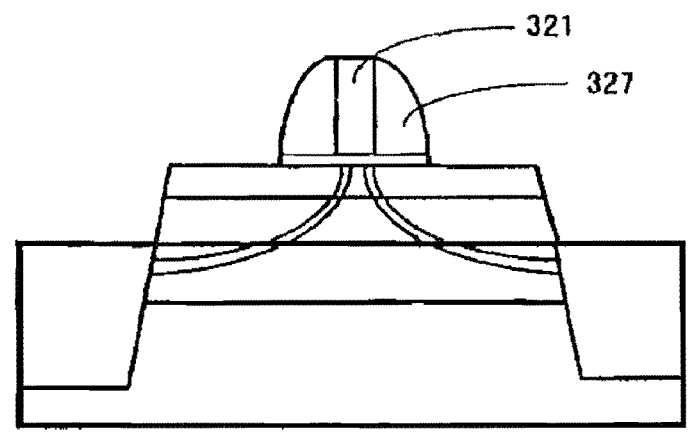

Next, as shown in FIG. 9C, the silicon oxide film 326 is anisotropically etched to allow the silicon oxide film to remain only in the side wall portions of the gate electrode 321 so that a side wall insulating film 327 is formed thereby. Although the silicon oxide film is used as the material of the side wall insulating film 327, the material is not limited to this and any other suitable insulating film can be used.

Figure 10A:
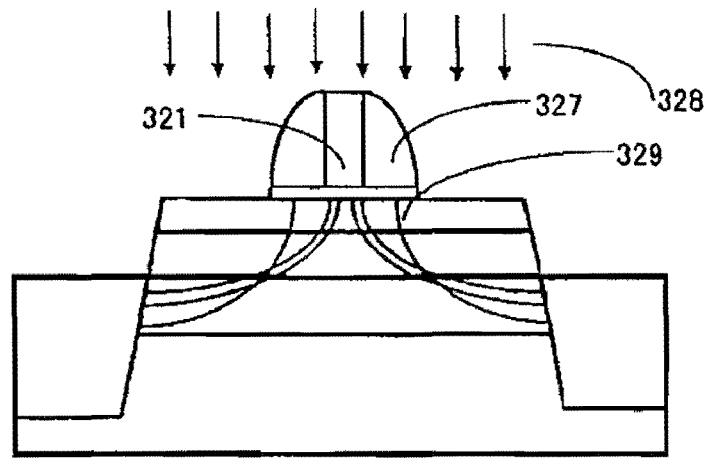
FIG. 10 includes Cross-sectional process diagrams (No. 4) showing the method for making the semiconductor device according to the second embodiment of the present invention.

As shown in FIG. 10A, a p-type dopant is introduced into the laminated substrate surface using the gate electrode 321 and the side wall insulating film 327 as the mask. In this manner, a deep dopant diffusion region 329 constituting a deep region of a source/drain diffusion layer is formed. As the p-type dopant, boron (B) is used, for example. As the ion implantation conditions, the acceleration voltage is 5 kev, the dosage is about $1\times10^{15}/cm^2$, and the angle of inclination is 0°. The extension region 325 and the deep dopant diffusion region 329 constitute a source/drain diffusion layer. Subsequently, activation annealing is conducted at, for example, 1000° C. for 1 second to thermally diffuse the dopant introduced.

Figure 10B:
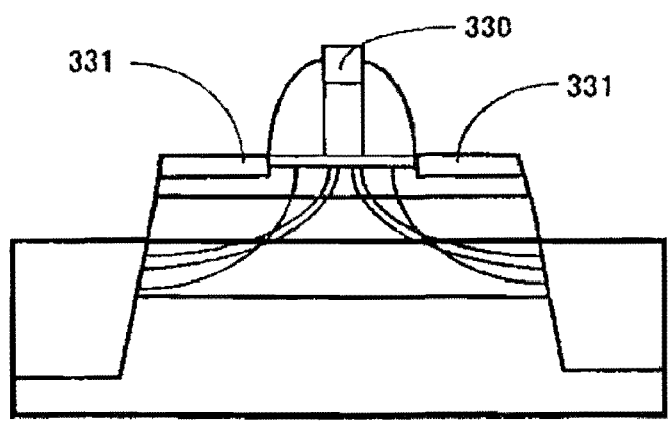

Next, as shown in FIG. 10B, a metal film having a thickness of, for example, about 10 nm is formed by nickel (Ni) by sputtering on the entire surface, and then heat treatment at 500° C. is conducted to allow Ni to react with Si in the laminated substrate and Ni to react with the gate electrode 321. The unreacted Ni is then removed to form a silicide film 330 composed of nickel silicide (NiSi) on the gate electrode 21 composed of polysilicon and a silicide film 331 composed of nickel silicide (NiSi) on the source/drain diffusion layer.

Figure 10C:
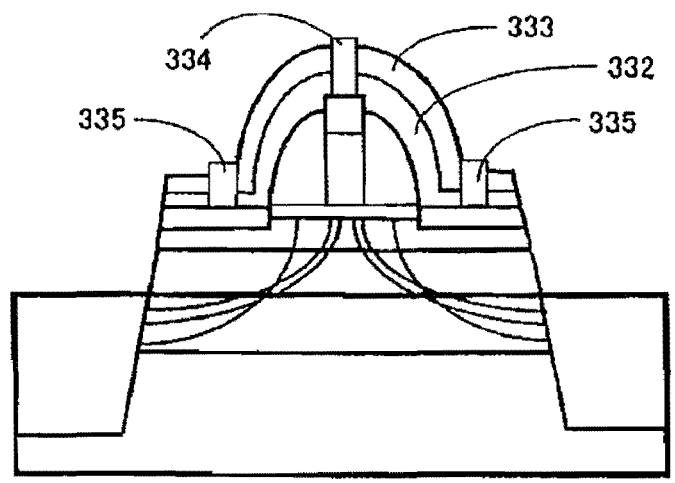

Next, as shown in FIG. 10C, a silicon nitride (SiN) film is formed by a CVD process to a thickness of about 50 nm to form an etching stop film 332, and then a silicon oxide ($SiO_2$) is deposited to a thickness of about 300 nm to form an interlayer insulating film 33. Then a contact hole is formed in the silicide film 331 on the silicide film 330 on the gate electrode and the source/drain diffusion layer, and a gate electrode 334 composed of tungsten (W) and a source/drain electrode 335 are formed to complete production of a p-type MOS transistor.

As described above, according to the second embodiment of the present invention, by intentionally introducing and controlling the positive and negative fixed charges into the interfaces of the laminated substrate, the reduction of leak current induced by a decrease in flat band voltage Vfb and an increase in threshold voltage Vth can be achieved. Furthermore, generation of low mobility holes in the interface between the gate insulating film and the Si cap layer can be suppressed upon application of a negative bias to the gate. Thus, a p-type MOS transistor with low power consumption and high driving current can be fabricated.

Although the detailed description of a fabrication process of a p-type MOS transistor of the present invention is provided above, it is of course possible to form an n-type MOS transistor as a semiconductor device of the present invention by changing the additional dopant in the semiconductor layer to one having an opposite conductivity type. Moreover, by forming a p-type MOS transistor and an n-type MOS transistor on the same silicon substrate, a semiconductor device having a CMOS transistor structure according to the present invention can be formed.

Moreover, in the embodiments above, the structure of the Si semiconductor material layers and the epitaxially grown layers of a SiGe semiconductor material have been described in detail above by referring to a MOS-type structure semiconductor device composed of a material having a large energy value at the valence band edge and a material having a large mobility with a small energy value, the combinatory structure of the materials is not limited to this. For example, a combination of a SiC material and a Si material is possible, and the advantages of the present invention are still achieved.

What is claimed is:

1. A semiconductor device comprising:
   a first semiconductor layer having an element region in which negative charges are introduced;
   a second semiconductor layer having a valence band edge energy value smaller than a valence band edge energy value of the first semiconductor layer, and a mobility larger than a mobility of the first semiconductor layer, the second semiconductor layer being strained;
   a third semiconductor layer having a valence band edge energy larger than the valence band edge energy of the second semiconductor layer, the third semiconductor layer being formed on the second semiconductor layer to form a heterojunction, and
   an insulating layer,
   wherein the first semiconductor layer, the second semiconductor layer, the third semiconductor layer and the insulating layer are sequentially stacked,
   wherein a threshold voltage of a MOS transistor on the third semiconductor layer is controlled by an introduction of positive fixed charges introduced into and near an interface between the first semiconductor layer and the second semiconductor layer, an introduction of negative fixed charges into and near an interface between the second semiconductor layer and the third semiconductor layer and introduction of negative fixed charges into and near the interface between the third semiconductor layer and the insulating layer.

2. A semiconductor device according to claim 1, wherein negative fixed charges introduced into and near an interface between the third semiconductor layer and the insulating layer are neutralized by introduction of positive fixed charges into and near the interface between the third semiconductor layer and the insulating layer.

3. A semiconductor device according to claim 1, wherein a decrease in mobility is suppressed by introduction of negative fixed charges into and near an interface between the second semiconductor layer and the third semiconductor layer.

4. A semiconductor device comprising:
   a first semiconductor layer having an element region in which negative charges are introduced;
   a second semiconductor layer having a valence band edge energy value smaller than a valence band edge energy value of the first semiconductor layer, and a mobility larger than a mobility of the first semiconductor layer, the second semiconductor layer being strained;
   a third semiconductor layer having a valence band edge energy larger than the valence band edge energy of the second semiconductor layer, the third semiconductor layer being formed on the second semiconductor layer to form a heterojunction;
   an insulating layer; and
   an element separation region in the first semiconductor layer, the element separation region defining the element region,
   wherein the first semiconductor layer, the second semiconductor layer, and the third semiconductor layer are sequentially stacked,
   wherein a threshold voltage of a MOS transistor on the third semiconductor layer is controlled by introduction of positive fixed charges into and near an interface between the element region in the first semiconductor layer and the second semiconductor layer, introduction of negative fixed charges into and near an interface between the second semiconductor layer and the third semiconductor layer, introduction of positive fixed charges into and near an interface between the third semiconductor layer and the insulating layer, and controlling the total of the charges to a positive value and a decrease in mobility of the MOS transistor on the third semiconductor layer is suppressed by introduction of negative fixed charges into and near an interface between the second semiconductor layer and the third semiconductor layer, and
   wherein a carrier region of the MOS transistor is present in the second semiconductor layer.

5. The semiconductor device according to claim 4, wherein the negative fixed charges are introduced along with diffusion of an element constituting the second semiconductor layer, and the positive fixed charges are introduced along with addition of nitrogen atoms from outside.

6. The semiconductor device according to claim 5, wherein the addition of nitrogen atoms is conducted through NO gas annealing.

7. The semiconductor device according to claim 5, wherein the first semiconductor layer is Si, the second semiconductor layer is SiGe, the third semiconductor layer is Si, the element is Ge, and the insulating layer is silicon oxide.

8. The semiconductor device according to claim 7, wherein the first semiconductor layer is n-type Si and the second semiconductor layer is n-type SiGe.

9. The semiconductor device according to claim 7, wherein the first semiconductor layer is p-type Si and the second semiconductor layer is p-type SiGe.

10. The semiconductor device according to claim 4, wherein the MOS transistor is a P type MOS transistor.

* * * * *